United States Patent
Ota (10) Patent No.: US 10,499,551 B2
(45) Date of Patent: Dec. 3, 2019

(54) ELECTRONIC COMPONENT MOUNTING SYSTEM

(71) Applicant: FUJI CORPORATION, Chiryu-shi (JP)

(72) Inventor: Katsushi Ota, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 264 days.

(21) Appl. No.: 15/512,216

(22) PCT Filed: Sep. 19, 2014

(86) PCT No.: PCT/JP2014/074853
§ 371 (c)(1),
(2) Date: Mar. 17, 2017

(87) PCT Pub. No.: WO2016/042660
PCT Pub. Date: Mar. 24, 2016

(65) Prior Publication Data
US 2017/0273227 A1    Sep. 21, 2017

(51) Int. Cl.
*H05K 13/04*    (2006.01)
*H05K 3/34*    (2006.01)
*H05K 13/08*    (2006.01)

(52) U.S. Cl.
CPC ......... *H05K 13/0465* (2013.01); *H05K 3/341* (2013.01); *H05K 3/3457* (2013.01);
(Continued)

(58) Field of Classification Search
CPC .......... H05K 13/0465; H05K 13/0495; H05K 13/04; H05K 13/0882; H05K 3/341; H05K 3/3463; H05K 3/3494
See application file for complete search history.

(56) References Cited

U.S. PATENT DOCUMENTS 4,283,847 A *   8/1981   May ..................... H05K 13/023
                                                          29/741
4,600,137 A *   7/1986   Comerford ............ B23K 1/085
                                                          228/102
(Continued)

FOREIGN PATENT DOCUMENTS

JP    2010-251511 A    11/2010

OTHER PUBLICATIONS

International Search Report dated Nov. 11, 2014 in PCT/JP2014/074853 filed Sep. 19, 2014.

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

An electronic component mounting system is disclosed. An elapsed time acquiring section acquires an elapsed time from printing onto circuit board by solder printer. A raising and lowering operation changing section changes raising and lowering operation of component holding tool based on the elapsed time from printing acquired by the elapsed time acquiring section. A mounter mounts an electronic component on the solder printed on circuit board by performing raising and lowering of the component holding tool at the raising and lowering operation changed by the raising and lowering operation changing section.

8 Claims, 9 Drawing Sheets

(52) U.S. Cl.
CPC ......... *H05K 3/3463* (2013.01); *H05K 3/3494* (2013.01); *H05K 13/04* (2013.01); *H05K 13/0495* (2013.01); *H05K 13/0882* (2018.08); *H05K 3/3468* (2013.01)

(56) References Cited

U.S. PATENT DOCUMENTS

| | | | | |
|---|---|---|---|---|
| 5,988,353 | A * | 11/1999 | Asai | H05K 13/0413 198/468.4 |
| 6,000,523 | A * | 12/1999 | Asai | H05K 13/041 198/377.08 |
| 6,378,198 | B1 * | 4/2002 | Asai | H05K 13/0061 29/825 |
| 8,448,834 | B2 * | 5/2013 | Hattori | H05K 3/1216 228/9 |
| 2002/0029468 | A1 * | 3/2002 | Koike | H05K 13/0413 29/832 |
| 2003/0170450 | A1 * | 9/2003 | Stewart | H05K 3/305 428/343 |
| 2007/0254255 | A1 * | 11/2007 | Neville | B23K 3/085 432/121 |
| 2015/0041200 | A1 * | 2/2015 | Hetzler | H05K 3/3494 174/260 |
| 2017/0348786 | A1 * | 12/2017 | Nakamura | H05K 3/1233 |

* cited by examiner

Solder A

| Elapsed time from printing | Less than T1 | T1 or greater and less than T2 | T2 or greater |
|---|---|---|---|
| Pressing force | F1 | F2 | - |

Solder a

| Elapsed time from printing | Less than t1 | t1 or greater and less than t2 | t2 or greater |
|---|---|---|---|
| Pressing time | L1 | L2 | - |

ELECTRONIC COMPONENT MOUNTING SYSTEM

TECHNICAL FIELD

The present invention relates to an electronic component mounting system for manufacturing electronic circuits by mounting electronic components on a circuit board.

BACKGROUND ART

Generally, in an electronic component mounting system, solder paste is printed by a printer onto lands formed on a circuit board, and electronic components are mounted on the printed solder using a mounter. The electrodes formed on the electronic components are provisionally positioned on the lands formed on the circuit board by the electronic components being mounted on the printed solder. Then, the circuit board is heated in a reflow device, such that the electronic components become soldered to the circuit board.

There are cases in which for some reason a mounter stops after solder is printed on the circuit board, but before an electronic component is mounted on the circuit board. While the mounter is stopped, the circuit board on which printing has been performed stands by waiting for the mounter to restart operation. However, if a long time passes since the solder was printed on the circuit board, the printed solder may dry out. In this case, when the mounter restarts operation, the component holding power of the solder may be insufficient when the electronic components are mounted on the solder, and electronic components that should have been successfully mounted may become dislodged from the solder. In other cases, when a component suction nozzle of the mounter attempts to mount the electronic component on the solder, because the component holding power of the solder is insufficient, the electronic component may fail to be released by the suction nozzle, and may be carried away on the suction nozzle.

In patent literature 1 below, for a circuit board on which solder has been printed, before electronic components are mounted on the circuit board using a mounter, a determination is made as to whether an estimation time, which is a time estimated to be required from completion of solder printing until starting to enter the reflow device, exceeds an allowance time. For circuit boards for which it is determined that the estimation time exceeds the allowance time, because it is supposed that the solder will exceed its allowance limit and dry out before the circuit board enters the reflow device, processing after the determination is prohibited.

CITATION LIST

Patent Literature

Patent literature 1 JP-A-2010-251511

SUMMARY OF INVENTION

Problem to be Solved

However, in conventional electronic component mounting systems, to reduce mounting defects caused by solder drying, the allowance time is set to be short. When the allowance time is set to be short, even short stoppages of the mounting device result in the estimation time being judged to have exceeded the allowance time. Thus, there is a problem in that processing after the determination may be prohibited for a large quantity of circuit boards.

Also, in the case of large circuit boards on which a large quantity of electronic components are mounted, such as boards used in, for example, computer servers, even if operation is performed correctly without operation stopping at any of the devices in the electronic component mounting system, the time from when solder is printed on the circuit board to when all the component mounting has been completed is considerably longer than the case of a small circuit board. In some cases, even if processing for a circuit board on which solder was printed by a printer is completed within normal processing time without any operation stoppages of the mounting devices, when mounting electronic components later in the mounting order, the solder printed on the circuit board may become somewhat dry.

Taking account of the above circumstances, an object of the present invention is to provide an electronic component mounting system that practically prevents electronic component mounting defects due to solder drying.

Means for Solving the Problem

To solve the above problems, an electronic component mounting system disclosed in this application includes: a solder printer that prints solder paste onto a circuit board; a mounter provided with (a) a board holding device that holds the circuit board, (b) a component supply device that supplies electronic components, and (c) a mounting device that picks up the electronic component supplied by the component supply device and mounts the picked up component on the circuit board held by the board holding device by raising and lowering a component holding tool; an elapsed time acquiring section that acquires an elapsed time from printing onto the circuit board by the solder printer; and a raising and lowering operation changing section that changes raising and lowering operation of the component holding tool based on the elapsed time from printing acquired by the elapsed time acquiring section; wherein the mounter mounts the electronic component on the solder printed on the circuit board by the solder printer by raising and lowering the component holding tool according to the raising and lowering operation changed by the raising and lowering operation changing section.

Effects of the Invention

In an electronic component mounting system configured as above, because raising and lowering operation of the component holding tool is changed based on the elapsed time from printing to the circuit board, it is possible to more practically prevent electronic component mounting defects caused by solder drying.

DESCRIPTION OF EMBODIMENTS

The following describes in detail referring to the figures an example embodiment of the present invention. Note that, for the present invention, as well as the below embodiment, embodiments with various changes based on the knowledge of someone skilled in the art are possible.

Figure 1:
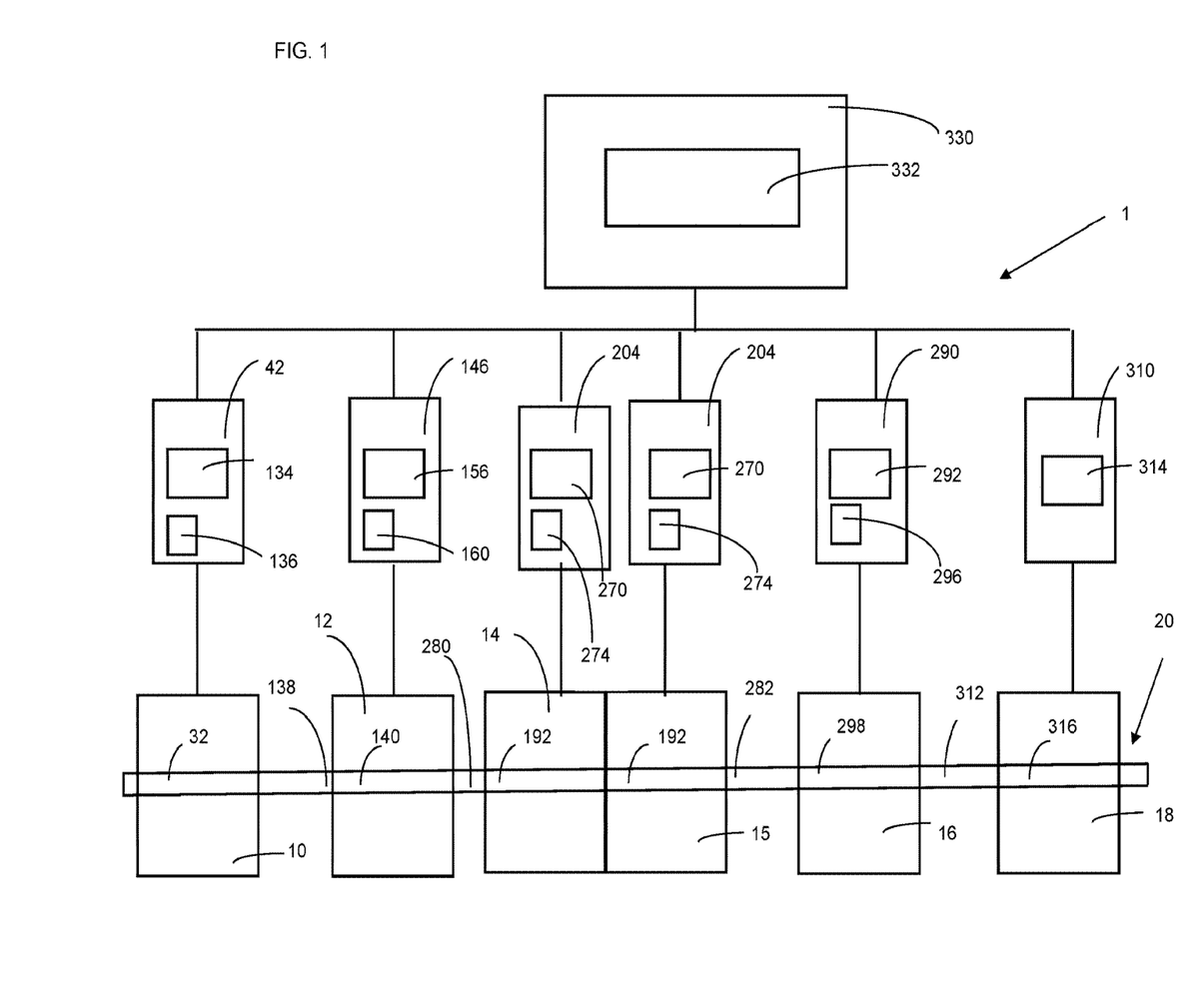
FIG. 1 is a schematic drawing showing an electronic component mounting line that is an embodiment of the present invention.

FIG. 1 shows electronic component mounting line 1, which is an embodiment of the present invention of an electronic component mounting system. Electronic component mounting line 1 includes, as work devices, solder printer 10, print inspection device 12, multiple mounters 14 and 15, mounting inspection device 16, reflow device 18, and conveyance device 20. The work devices are arranged closely adjacent to each other in a line in the order as listed above. Circuit boards are conveyed by conveyance device 20 from solder printer 10 provided at the upstream side of electronic component mounting line 1 to reflow device 18 provided at the downstream side. Note that, print inspection device 12 and mounting inspection device 16 are not essential for the present invention. Also, there may only be a single mounter, or there may be three or more mounters.

Conveyance device 20 includes the conveyance devices provided in each of the work devices, and the conveyance devices provided between each of solder printer 10 and print inspection device 12, print inspection device 12 and mounter 14, mounter 15 and mounting inspection device 16, and mounting inspection device 16 and reflow device 18. A conveyance device is not provided between mounter 14 and mounter 15, with circuit boards being conveyed directly from mounter 14 to mounter 15. Note that, the conveyance devices between each of the work devices may be omitted, with circuit boards being transferred directly between the conveyance devices of each of the work devices. Also, a conveyance device may be provided between mounter 14 and 15. Conveyance device 20 may be configured, for example, from a belt conveyor. Conveyance device 20 supports circuit board 28 to be in a horizontal state and conveys circuit board 28 from left to right as in FIG. 1. Hereinafter the conveyance direction of circuit board 28 will be referred to as the X-axis direction, and the direction perpendicular to the X-axis direction in a horizontal plane will be referred to as the Y-axis direction.

Solder printer 10 is a screen printer that prints solder paste onto a circuit board using a screen. Solder printer 10 includes conveyance device 32 as a conveyance device provided in solder printer 10. Further, solder printer 10 includes an imaging device configured from, for example, a CCD camera. The imaging device provided in solder printer 10 images reference marks 54 provided on the circuit board, and reference marks provided on the screen.

Figure 2:
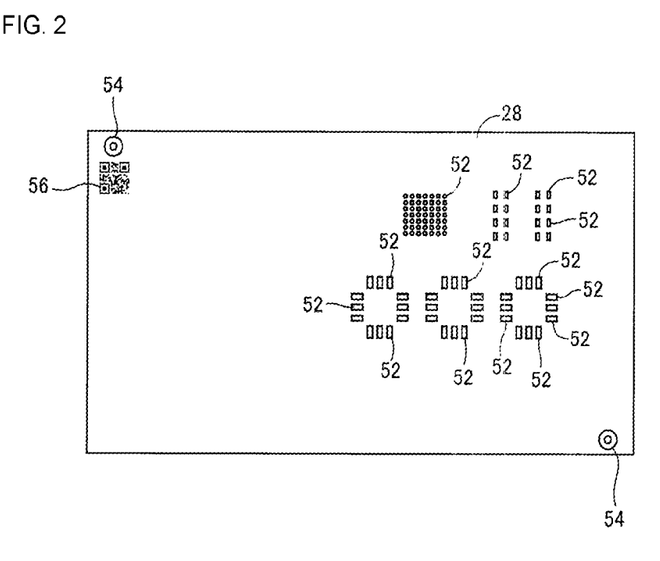
FIG. 2 is a plan view schematically showing a circuit board onto which electronic components are to be mounted in the above electronic component mounting line.

As shown schematically in FIG. 2, multiple lands 52 are formed on circuit board 28. Solder printer 10 prints solder on the multiple lands of circuit board 28. Also, multiple, for example, two, reference marks 54 are provided on circuit board 28 at two points on a diagonal line, as is 2D code 56. 2D code 56 contains a board identification code that represents data that identifies the individual circuit board 28 (such as the type, manufacturer, and lot number of circuit board 28).

Controller 42 of solder printer 10, as shown schematically in FIG. 1, is configured mainly from computer 134. Computer 134 controls the drive sources and so on of conveyance device 32 and the like via drive circuits (omitted from figures). Also, image data obtained from imaging by the imaging device of the solder printer is processed by image processing computer 136. Data obtained by image processing computer 136 is sent to computer 134.

As shown schematically in FIG. 1, conveyance device 138 is provided between solder printer 10 and print inspection device 12. Circuit board 28 for which solder printing is complete is unloaded from conveyance device 32 to conveyance device 138, and is loaded from conveyance device 138 to print inspection device 12.

Print inspection device 12 inspects the state of the solder printed on circuit board 28 using an imaging device configured from, for example, a CCD camera. Print inspection device 12 includes conveyance device 140 as a conveyance device provided in print inspection device 12.

As shown schematically in FIG. 1, controller 146 of print inspection device 12 is configured mainly from computer 156. Computer 156 controls the drive sources and so on of conveyance device 140 and the like via drive circuits (omitted from figures). Image data obtained from imaging by the imaging device of solder inspection device 12 is processed by image processing computer 160. Data obtained by image processing computer 160 is sent to computer 156.

As shown schematically in FIG. 1, conveyance device 280 is provided between print inspection device 12 and mounter 14. Circuit board 28 for which print inspection is complete is unloaded from conveyance device 140 to conveyance device 280, and is loaded from conveyance device 280 to mounter 14.

Figure 3:
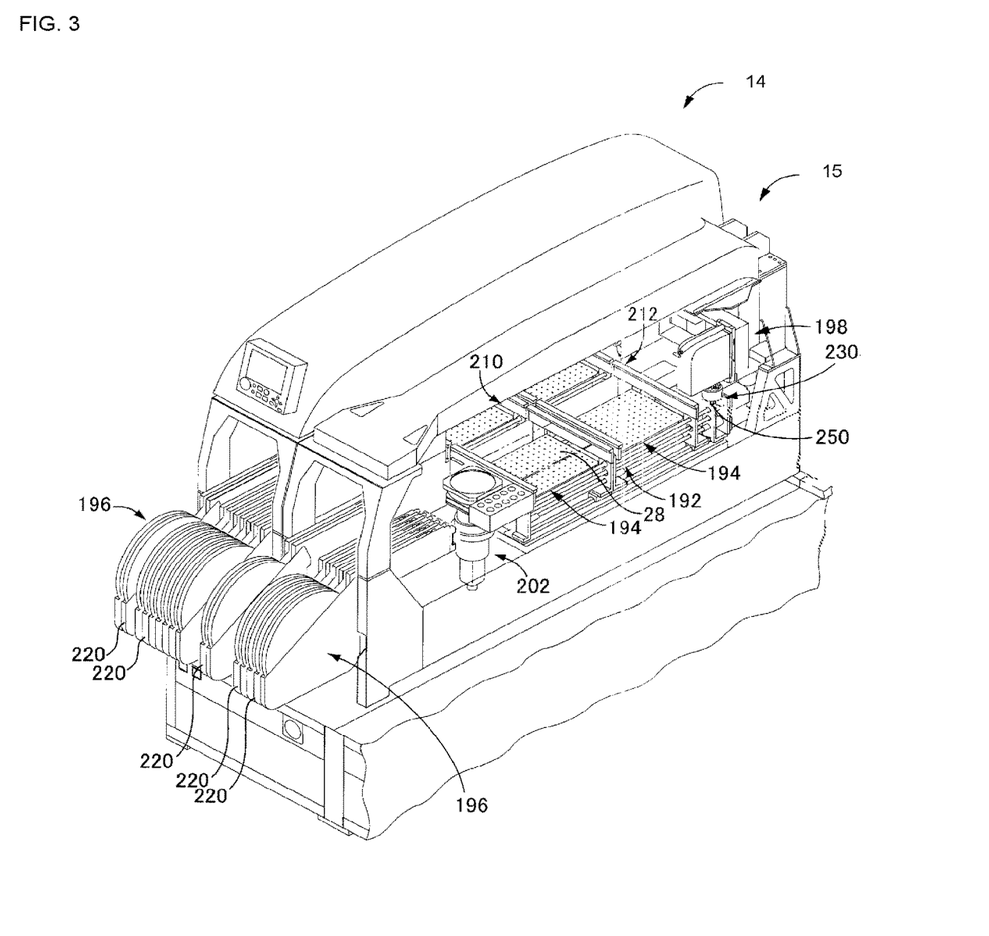
FIG. 3 is a perspective view showing mounters that configure the above electronic component mounting line.

FIG. 3 is a perspective view of mounter 14 and mounter 15. Because the configuration of mounters 14 and 15 is substantially identical, here mounter 15 only is described with reference to FIG. 3. Mounter 15 includes conveyance device 192 as a conveyance device provided within each mounter. In the present embodiment, conveyance device 192 is provided with two conveyors, 210 and 212, but conveyance device 192 may be provided with only one conveyor. Conveyance device 192 may be provided with three or more conveyors.

Mounter 15 is also provided with board holding device 194, component supply device 196, mounting device 198, mark imaging device 200, component imaging device 202, and controller 204.

Board holding device 194 holds circuit board 28 such that the mounting surface, onto which electronic components are to be mounted, is horizontal.

Component supply device 196, for example, supplies electronic components using tape feeder 220, which is a type of component supply tool. The component supply tool may be a tray feeder, bulk feeder, stick feeder, wafer feeder, and so on.

Mounting device 198 includes mounting head 230 and X-Y moving device 232. Mounting head 230 is moved along the X-Y plane by X-Y moving device 232 above component supply device 196 and above board holding device 194 that holds circuit board 28. Suction nozzle 250, provided as a component pickup tool on mounting head 230, is raised and lowered in the Z-axis direction, which is perpendicular to the X-Y plane, by Z-axis moving device 234, described below, thereby allowing mounting head 230 to pick up an electronic component from component supply device 196 and mount the picked up component on circuit board 28.

Figure 4:
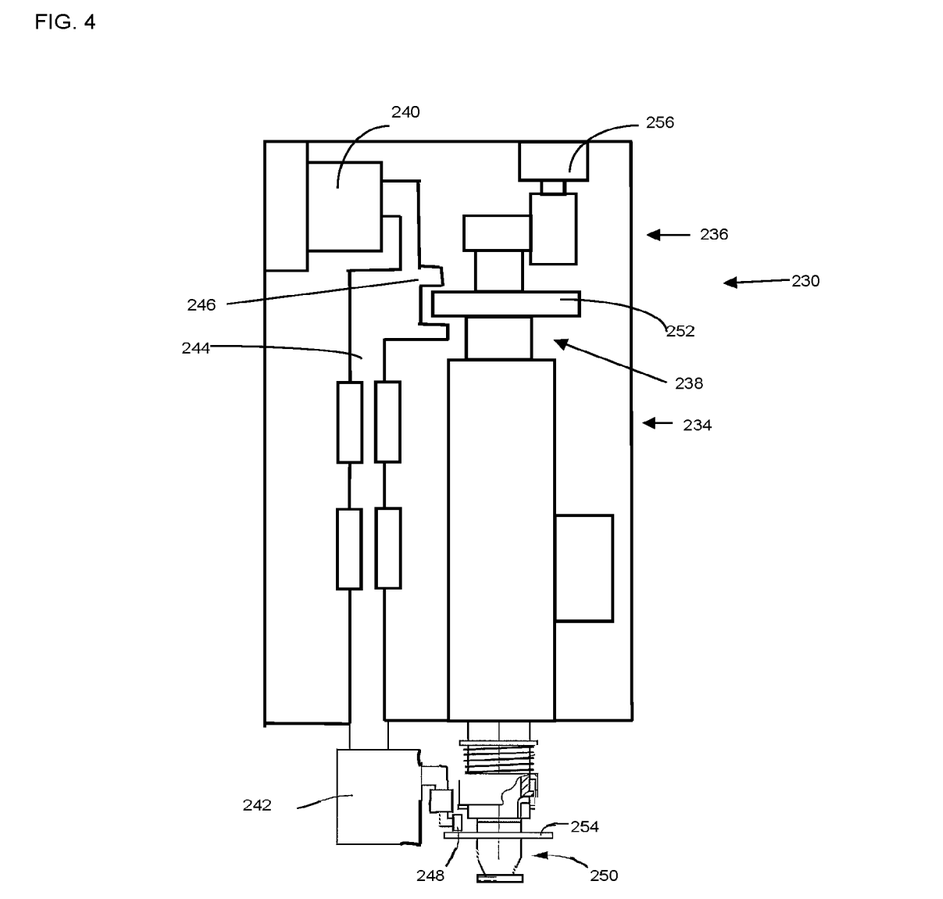
FIG. 4 is a front view schematically showing a mounting head of the mounter that configures the above electronic component mounting line.

FIG. 4 shows an example of mounting head 230. Mounting head 230 is provided with mounting head main body 236. Mounting head main body 236 is provided with Z-axis moving device 234 configured from rotating-raising-and-lowering shaft 238, first linear motor 240, second linear motor 242, raising and lowering drive member 244, and the like. Suction nozzle 250 is held on the lower end section of rotating-raising-and-lowering shaft 238. Suction nozzle 250 is held to be relatively movable in the shaft direction with respect to rotating-raising-and-lowering shaft 238, and not relatively rotatable with respect to rotating-raising-and-lowering shaft 238. First linear motor 240 functions as a first raising and lowering drive device that raises and lowers rotating-raising-and-lowering shaft 238 as a first raising and lowering member and second linear motor 242 as a second raising and lowering drive member. Therefore, raising and lowering drive member 244 as a second raising and lowering member is attached to first linear motor 240. Raising and lowering member 244 extends in the vertical direction along rotating-raising-and-lowering shaft 238, includes first engaging section 246 at an intermediate section, and holds second linear motor 242 on a lower end section. Second linear motor 242 includes second engaging section 248. First engaging section 246 and second engaging section 248 are respectively engaged with flange 252 provided near the top of rotating-raising-and-lowering shaft 238 and flange 254 of suction nozzle 250 in a state that allows the rotation of rotating-raising-and-lowering shaft 238 and suction nozzle 250.

Rotating-raising-and-lowering shaft 238 is rotated by electric motor 256 provided above rotating-raising-and-lowering shaft 238 and a gear. Rotation of rotating-raising-and-lowering shaft 238 is transmitted to suction nozzle 250 via a mechanism that is not shown in the figure.

When lowering suction nozzle 250, first linear motor 240 is operated such that raising and lowering drive member 244 is lowered. By this, rotating-raising-and-lowering shaft 238 and second linear motor 242 are lowered. In parallel to this, second linear motor 242 is operated such that suction nozzle 250 is lowered.

Mark imaging device 200 is configured from, for example, a CCD camera. Mark imaging device 200 is provided on the lower end of X-Y moving device 232 so as to be movable together with mounting head 230 to any position in a horizontal plane. Because mark imaging device 200 is provided such that the imaging direction faces circuit board 28, mark imaging device 200 images reference marks 54 provided on circuit board 28 from above.

Component imaging device 202 is configured from, for example, a CCD camera. Component imaging device 202 images an electronic component held by suction nozzle 250 from below.

Figure 5:
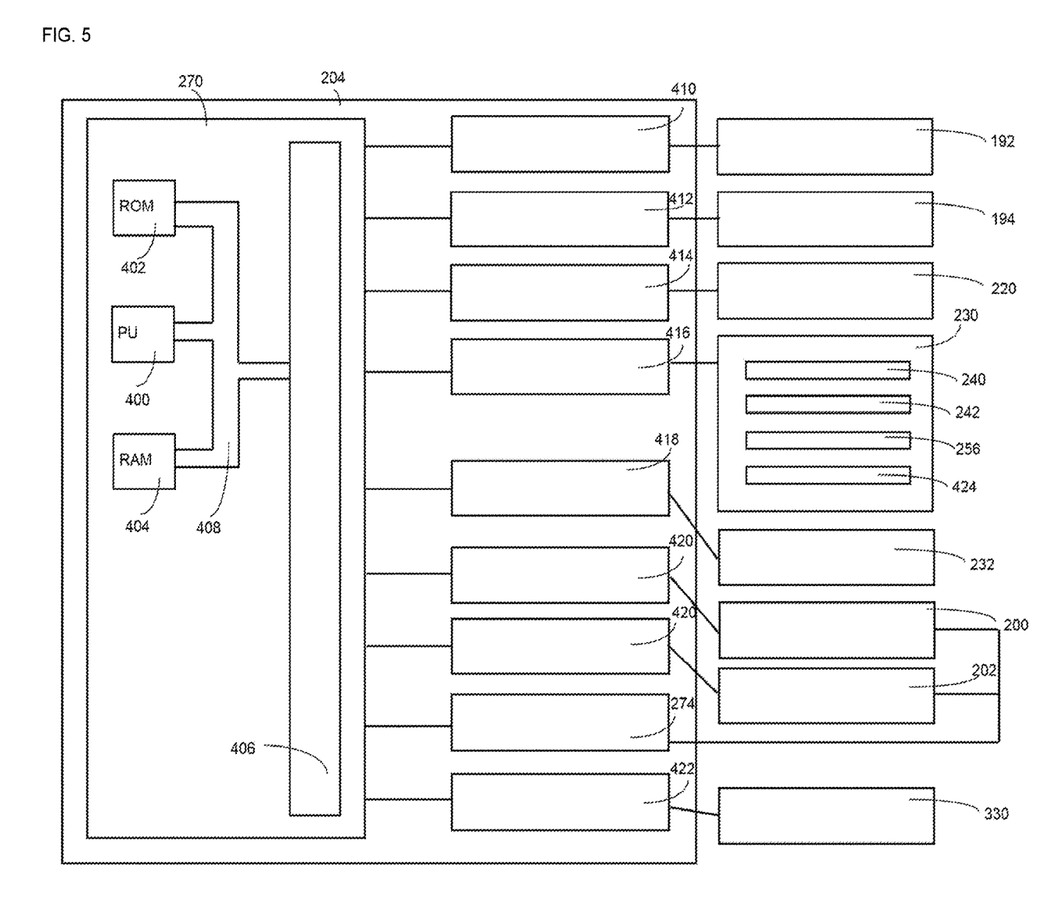
FIG. 5 is a block diagram related to control of the controller of the above mounter.

As shown schematically in FIG. 5, controller 204 is configured mainly from computer 270. Computer 270 includes PU (processing unit) 400, ROM 402, RAM 404, input/output interface 406, and bus 408 that connects these items to each other. Conveyance device 192, board holding device 194, tape feeders 220, mounting head 230, X-Y moving device 232 and so on are respectively connected to input/output interface 406 of computer 270 via drive circuits 410, 412, 414, 416, and 418. Also, mark imaging device 200 and component imaging device 202 are connected to input/output interface 406 via control circuit 420. Data obtained from imaging by mark imaging device 200 and component imaging device 202 is processed by image processing computer 274. Data obtained from image processing computer 274 is inputted to computer 270 via input/output interface 406. Overall controller 330, which is described later, is connected to input/output interface 406 via communication circuit 422.

Mounting head 230 of the present embodiment, when mounting an electronic component held by suction nozzle 250 onto circuit board 28, is able to change the pressing force, which is the pressing force with which suction nozzle 250 presses the electronic component against the printed solder, according to instructions from computer 270. Specifically, instructions regarding the position of second linear motor 242 required for suction nozzle 250 to press the electronic component with the desired pressing force are issued to drive circuit 416 from computer 270. Drive circuit 416 supplies second linear motor 242 with the current necessary to match the position indicated by encoder 424 and the instructed position. In this manner, suction nozzle 250 is able to mount the electronic component on circuit board 28 with the desired pressing force according to instructions from computer 270.

Circuit board 28 for which component mounting in mounter 14 has been completed is conveyed directly to mounter 15.

As shown schematically in FIG. 1, conveyance device 282 is provided between mounter 15 and mounting inspection device 16. Circuit board 28 for which component mounting in mounter 15 has been completed is loaded from conveyance device 192 of mounter 15 to conveyance device 282, and is then loaded from conveyance device 282 to mounting inspection device 16.

Mounting inspection device 16 is configured in a similar manner to the above print inspection device 12. Mounting inspection device 16 inspects the state of the components mounted on circuit board 28 using an imaging device configured from, for example, a CCD camera. Mounting inspection device 16 includes conveyance device 298 as a conveyance device provided in mounting inspection device 16.

As shown schematically in FIG. 1, controller 290 of mounting inspection device 16 is configured mainly from computer 292. Computer 292 controls the drive sources and so on of conveyance device 298 and the like via drive circuits (omitted from figures). Image data obtained from imaging by the imaging device of mounting inspection device 16 is processed by image processing computer 296. Data obtained by image processing computer 296 is sent to computer 292.

As shown schematically in FIG. 1, conveyance device 312 is provided between mounting inspection device 16 and reflow device 18. Circuit board 28 for which mounting inspection is complete is unloaded from conveyance device 298 of mounting inspection device 16 to conveyance device 312, and is loaded from conveyance device 312 to reflow device 18.

Reflow device 18 includes conveyance device 316 as a conveyance device provided in reflow device 18. Further, reflow device 18 is provided with a heating device (not shown) and controller 310. Controller 310 is configured mainly from computer 314 and controls the drive sources and the like of conveyance device 316 and so on.

Overall control of electronic component mounting line 1 configured from solder printer 10, print inspection device 12, mounters 14 and 15, mounting inspection device 16, reflow device 18, and conveyance devices 138, 280, 282, and 312 provided between each of the work devices is performed by overall controller 330. Overall controller 330 is configured mainly from host computer 332. Overall controller 330 is connected to controllers 42, 146, 204, 290, and 310 by communication circuit 422, and performs communication and so on of data, instructions, and the like. Print time memory is provided in the RAM of host computer 332 as a print time memorizing section. Also, correlation data is memorized in the ROM of host computer 332.

In the present embodiment, print time memory is memory that memorizes information linking a board identification code with a solder print time that is the time at which solder was printed on the board. Information linking the board identification code and the print time is sent from computer 134 of solder printer 10.

Figure 6:
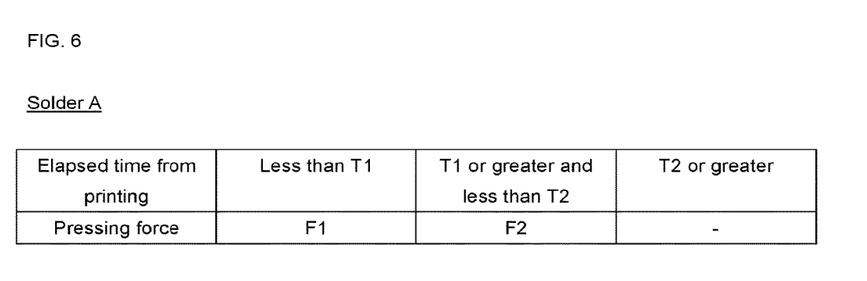
FIG. 6 illustrates an example of correlation data.

In the present embodiment, correlation data is data representing the relationship between the elapsed time from solder printing and the mounting parameter appropriate for mounting the electronic component on the printed solder. The mounting parameter is a parameter used to perform control related to raising and lowering operation of suction nozzle 250. In FIG. 6, a pressing force, which is a pressing force with which suction nozzle 250 presses the electronic component against solder printed on circuit board 28, is used as an example of a mounting parameter. Correlation data is created using values obtained during tests and so on performed in advance. Because the degree of drying of the solder as time elapses depends on the type of solder, in the present embodiment different correlation data is prepared for each type of solder. FIG. 6 shows correlation data of solder A. Correlation data corresponding to the type of solder used in production is read from the ROM of host computer 332 before starting production of a circuit board 28 at electronic component mounting line 1, and memorized in each RAM 404 of computer 270 of mounters 14 and 15.

In FIG. 6, for a case in which the elapsed time from printing is less than T1, pressing force F1 is set. When the elapsed time from printing is T1 or greater and less than T2 (T2>T1), pressing force F2 (F2>F1) is set. If the elapsed time from printing is T2 or greater, the solder drying is severe, and the component cannot be held by the solder even if the pressing force is increased. Therefore, if the elapsed time from printing is T2 or greater, a pressing force is not set.

With electronic component mounting line 1 configured as given above, circuit boards 28 are supplied to solder printer 10 by a board supply device, which is not shown in the figures. Circuit board 28 is conveyed by conveyance device 32 and stopped at a specified printing position. Then, the imaging device of solder printer 10 images reference marks 54 provided on circuit board 28, and reference marks provided on the screen. Image processing computer 136 calculates the relative positional deviation of the screen and circuit board 28 by performing appropriate processing on the image data of the reference marks. Based on the calculated relative positional deviation, computer 134 performs appropriate control to correct the relative positional deviation of the screen and circuit board 28. Also, the imaging device of solder printer 10 images 2D code 56 provided on circuit board 28. By processing performed by image processing computer 136, the board identification code is read and the circuit board on which solder is to be printed is identified. The board identification code is sent to computer 134.

After the reference marks are imaged by the imaging device of solder printer 10, solder is printed on circuit board 28. After printing of solder on circuit board 28 is complete, the printing complete time is sent from computer 134 to host computer 332 as the print time, linked to the obtained board identification code. The print time is memorized in the print time memory of host computer 332.

Circuit board 28 is conveyed from solder printer 10 to conveyance device 138, and is transferred from conveyance device 138 to conveyance device 140 of print inspection device 12. Print inspection device 12 inspects the state of the solder printed on circuit board 28. After print inspection, circuit board 28 is conveyed to conveyance device 280, and is loaded from conveyance device 280 to mounter 14.

Figure 7:
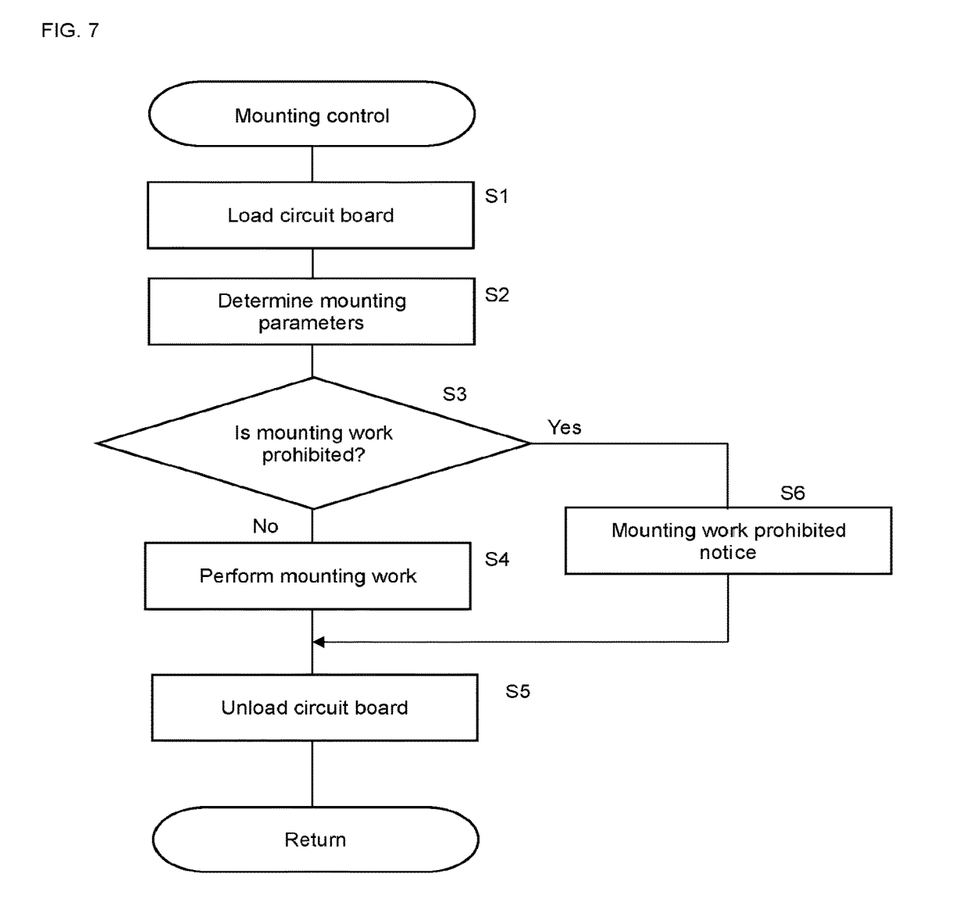
FIG. 7 is a flowchart showing a mounting control routine.

In mounter 14, the mounting control routine shown in FIG. 7 is performed by computer 270. First, by performing S1, circuit board 28 is loaded into mounter 14. Circuit board 28 is stopped at a specified mounting position. Circuit board 28 is held by board holding device 194. Here, the stop time, which is the time at which circuit board 28 was stopped, is memorized in the arrival time memory, which acts as the arrival time memorizing section in RAM 404 of computer 270, as the arrival time, which is the time at which circuit board 28 arrived at mounter 14. Then, mark imaging device 200 images reference marks 54 and 2D code 56 of circuit board 28. Image processing computer 274 calculates the positional error of circuit board 28 by performing processing of the image data of reference marks 54. Also, image processing computer 274 reads the board identification code by processing image data of 2D code 56.

Next, by performing S2, the mounting parameter is determined. This determination is performed according to the mounting parameter determining routine shown in FIG. 8. First, by performing S11, the board identification code read based on the image of 2D code 56 is read from image processing computer 274 to computer 270 of mounter 14. Based on this, the circuit board 28 that has arrived at mounter 14 is identified.

Figure 8:
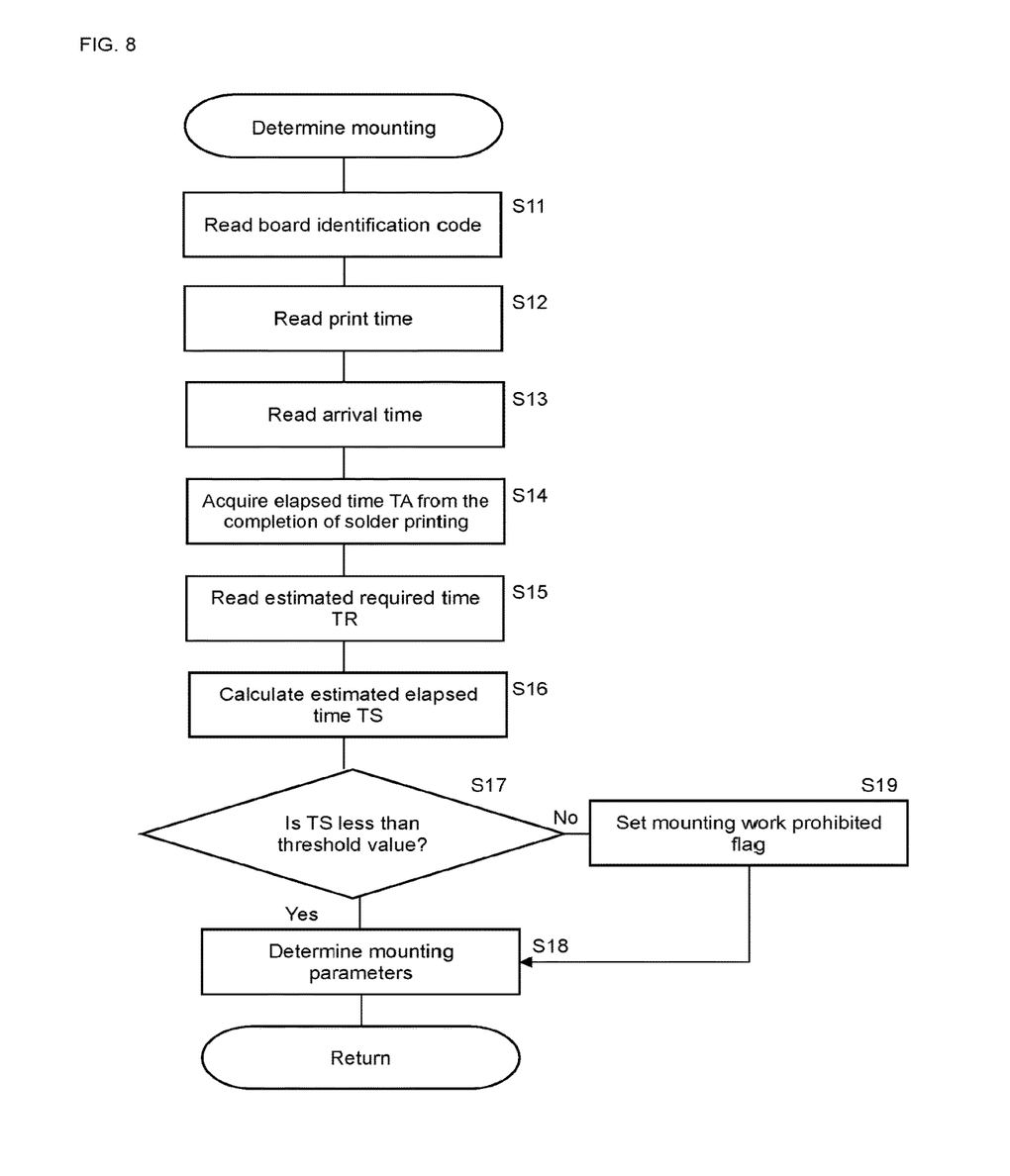
FIG. 8 is a flowchart showing a mounting parameter determining routine.

Next, by performing S12, the printing complete time memorized and linked to the board identified code is read from the print time memory of host computer 332 based on the board identification code. Next, by performing S13, the arrival time, that is, the stop time, which is the time memorized when conveyance of circuit board 28 stopped, is read from the arrival time memory. Then, by performing S14, elapsed time TA from the completion of solder printing to the arrival of circuit board 28 at mounter 14 is calculated. Elapsed time TA is obtained by subtracting the printing completion time from the stop time of circuit board 28.

Next, by performing S15, estimated required time TR is read. Estimated required time TR is the time estimated to be required from the point in time at which circuit board 28 arrived at the target mounter to the point in time at which that mounter is scheduled to complete work. In this case, estimated required time TR set for mounter 14 is read. Estimated required time TR can be set for each mounter within component mounting line 1 based on the program created for completing the electronic circuit of circuit board 28. Specifically, the estimated required time is able to be set by determining the contents of work that should be performed by the target mounter on the circuit board 28, such as which components and in what order the target mounter should mount on the circuit board 28. Note that, in the present embodiment, a single estimated required time TR is set for one mounter, but the series of work to be performed by one mounter can be divided into sections, and an estimated required time may be set for each section. Accordingly, in the present embodiment, for example, all the work of the series of work to be performed by mounter 14 is set as scheduled work of mounter 14, and estimated required time TR is set as the time estimated to be required until the completion of the final work in the series of work to be performed by mounter 14.

Estimated required time TR of mounter 14 is read from the estimated required time memory of the ROM of host computer 332 and memorized in RAM 404 of computer 270 of mounter 14 before starting production of circuit board 28 at electronic component mounting line 1. The type of circuit board 28 on which components are to be mounted at electronic component mounting line 1 is known by host computer 332, and based on that type the estimated required time TR of mounter 14 is read from the estimated required time memory and supplied to and memorized in mounter 14 from host computer 332. In S15, that memorized estimated required time TR is read.

Next, by performing S16, estimated elapsed time TS is calculated based on the sum of elapsed time TA obtained in S14 and estimated required time TR read in S15. Estimated elapsed time TS is the time estimated to be required from the completion of solder printing to completion of work at the target mounter, in this case, mounter 14. Estimated elapsed time TS may be the sum of elapsed time TA and estimated required time TR itself, or may be a value obtained from the sum and some kind of coefficient.

Next, by performing S17, computer 270 determines whether estimated elapsed time TS is less than a tolerance value. The tolerance value of estimated elapsed time TS is set in advance based on the time required for solder to dry to the extent that an electronic component cannot be appropriately mounted on circuit board 28. In the present embodiment, the tolerance value is set to T2.

In a case in which estimated elapsed time TS is determined to be less than the tolerance value in S17, in order to change the raising and lowering operation of suction nozzle 250, the mounting parameter is determined in S18.

The mounting parameter is determined by referring to the the correlation data memorized in RAM 404. Computer 270 takes the calculated estimated required time TS as the elapsed time from printing, and determines the mounting parameter as appropriate based on estimated elapsed time TS.

For example, in a case in which estimated elapsed time TS is T1 or greater and less than T2, pressing force F2 is determined as the mounting parameter. Accordingly, because a time from printing T1 or greater and less than T2 has elapsed, compared to a case in which only a time less than T1 has elapsed since printing, even though the solder has dried, by changing the pressing force, which is one of the raising and lowering operations of suction nozzle 250, and thus pressing the electronic component with a sufficient pressing force of F2, it is possible to reliably hold the electronic component in the solder.

On the other hand, in a case in which estimated elapsed time TS is determined to be equal to or greater than the threshold value in S17, S19 is performed and the mounting work prohibited flag provided in RAM 404 of computer 270 is set to one, and the mounting parameter determining routine is ended.

In S3 of the mounting control routine, it is determined whether to prohibit mounting work based on whether the mounting work prohibited flag is set. That is, in the present embodiment, if estimated elapsed time TS is less than T2, because the mounting work prohibited flag is not set, it is determined that mounting work is not prohibited, and processing proceeds to S4. If estimated elapsed time TS is T2 or greater, because the mounting work prohibited flag is set, it is determined that mounting work is prohibited, and processing proceeds to S6.

In S4, mounting work of mounting electronic components on circuit board 28 is performed. Mounting head 230 is moved by X-Y moving device 232, and after an electronic component is received from tape feeder 220, mounting head 230 is moved to board holding device 194. Computer 270 controls mounting 230 such that the electronic component is mounted on circuit board 28 using the determined mounting parameter. That is, computer 270 controls mounting head 230 by changing raising and lowering operation of suction nozzle 250 to be appropriate for estimated elapsed time TS.

When work to be performed by mounter 14 has been completed, S5 is performed such that circuit board 28 is conveyed from mounter 14 and loaded into mounter 15.

On the other hand, if it was determined that mounting work is prohibited in S3 of the mounting control routine, processing proceeds to S6. In S6, computer 270 prohibits mounting work of mounting electronic components on circuit board 28, and notifies an operator by a visual or audio means, not shown.

The mounting processing routine shown in FIG. 7 and the mounting parameter determining routine shown in FIG. 8 are performed at mounter 15 in the same manner as at mounter 14. When work to be performed by mounter 15 has been completed, circuit board 28 is conveyed from mounter 15 via mounting inspection device 16 and reflow device 18 and processing at electronic component mounting line 1 is completed.

As is clear from the descriptions above, in the above embodiment, estimated elapsed time TS is an example of an elapsed time from printing. In computer 270, a portion that performs at least a portion of S12, S13, S14, or S16 is an example of an elapsed time acquiring section. In computer 270, a portion that performs S18 is an example of a raising and lowering operating changing section. In computer 270, a portion that performs S18 is an example of a mounting parameter determining section. At least one of estimated required time memory of host computer 332 and RAM 404 of computer 270 is an example of an estimated required time memorizing section. At least one of the ROM of host computer 332 and RAM 404 of computer 270 is an example of a correlation data memorizing section.

Note that, in the above embodiment, as the mounting parameter, a pressing force, which is the pressing force with which suction nozzle 250 presses the electronic component against the solder printed on circuit board 28, is used, but a different mounting parameter may be used. For example, FIG. 9 shows a different example of correlation data.

Figure 9:
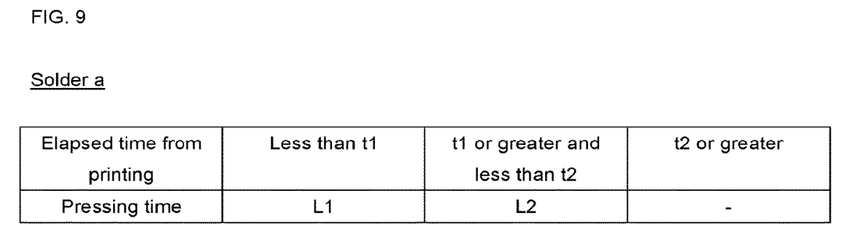
FIG. 9 illustrates an alternative example of correlation data.

In FIG. 9, as the mounting parameter, a pressing time, which is the time for which suction nozzle 250 presses the electronic component against the solder printed on the circuit board, is used. Similar to the example of FIG. 6, the correlation data shown in FIG. 9 is created using values obtained during tests and so on performed in advance. With the correlation data shown in FIG. 9, too, different data is prepared for each type of solder. FIG. 9 shows correlation data for solder a.

In FIG. 9, in a case in which the elapsed time from printing is less than t1, pressing time L1 is set. In a case in which the elapsed time from printing is t1 or greater and less than t2 (t2>t1), pressing time L2 (L2>L1) is set. If the elapsed time from printing is t2 or greater, the solder drying is severe, and the component cannot be held by the solder even if the pressing time is increased. Therefore, if the elapsed time from printing is t2 or greater, a pressing time is not set.

When a pressing time for when the suction nozzle presses the electronic component against the solder printed on the circuit board is used as the mounting parameter, a mounting head capable of changing the pressing time according to instructions from the computer of the mounter is prepared. Specifically, with the pressing time determined by the above mounting parameter determining routine, to press the electronic component on the solder printed on the circuit board, in S4 of the above mounting control routine, the computer of the mounter instructs the drive circuit of the mounting head to supply current for the required amount of time, such that the drive circuit of the mounting head supplies current for the required amount of time to the raising and lowering drive device that raises and lowers the suction nozzle. In this manner, the suction nozzle is able to press the electronic component on the solder printed on the circuit board for the pressing time determined as the mounting parameter.

With the examples of correlation data shown in FIGS. 6 and 9, data representing the relationship between elapsed time from solder printing and a mounting parameter are prepared for each type of solder, but it is not essential for this invention for the configuration to use different correlation data for different types of solder. Instead of solder type, or in addition to solder type, data may be prepared that considers factors such as humidity level when performing circuit board mounting, land surface area, weight of electronic component, shape of electronic component, and so on.

With the examples of correlation data shown in FIGS. 6 and 9, the elapsed time from solder printing was divided into steps, and the mounting parameter set to correspond to each step, however, the correlation data may be an approximate function created based on values obtained in advance by tests or the like. To using an approximate function as correlation data, it is possible to determine a mounting parameter that appropriately corresponds to the elapsed time from solder printing more finely.

In the above embodiment, the mounting parameter determining routine calculates a single estimated elapsed time TS for one mounter, and determines a single mounting parameter based on that estimated elapsed time TS. However, the series of mounting work to be performed by one mounter may be divided into sections, an estimated required time may be calculated for each section, and a mounting parameter determined for each section. Thus, even in a case in which the series of mounting work to be performed by one mounter takes a long time, it is possible to change the appropriate raising and lowering operation of suction nozzle 250 more finely.

In the above embodiment, estimated elapsed time TS calculated based on elapsed time TA is taken as the elapsed time from printing, and the mounting parameter is decided based on the estimated elapsed time TS. However, elapsed time TA, which is the time from the point in time at which solder printing was completed to the point in time at which the circuit board arrived at the mounter, may be taken as the elapsed time from printing, and raising and lowering operation of suction nozzle 250 may be changed based only on elapsed time TA.

In the above embodiment, elapsed time TA, which is the time elapsed from solder printing completion to the arrival of the circuit board at the mounter, is obtained by performing calculation based on actual times, that is, the print time, which is the time at which solder printer 10 printed solder on circuit board 28, and the arrival time, which the time at which circuit board 28 arrived at mounter 14. However, the elapsed time from printing may be obtained from measuring the time.

Specifically, after the solder printer has finished printing solder on the circuit board, the computer of the solder printer may send a notification to the host computer that printing for that circuit board has been completed, linked to the board identification code of the printed circuit board. A counter may be provided in the host computer. When the host computer receives the printing complete notification, the host computer may start timing using the counter. When the circuit board arrives at the mounter, the computer of the mounter may send a notification to the host computer indicating that the circuit board has arrived at the mounter, linked to the board identification code of the circuit board that has arrived. Then, the counter value corresponding to the board identification code may be read from the host computer. This counter value represents the elapsed time from completion of solder printing to arrival of the circuit board at the mounter. The elapsed time from printing may also be acquired in this manner.

In the above embodiment, as the elapsed time from printing, elapsed time TA is obtained in which the starting point is the point in time at which solder printer 10 finished printing solder on circuit board 28. However, the starting point of the elapsed time from printing may be a point in time other than the completion time of printing. For example, the starting point may be the point in time at which the circuit board was loaded into the solder printer.

REFERENCE SIGNS LIST

10: solder printer; 14, 15: mounter; 28: circuit board; 194: board holding device; 196: component supply device; 198: mounting device; 250: suction nozzle; 270: computer

The invention claimed is:
1. An electronic component mounting system comprising:
a solder printer that prints solder paste onto a circuit board;
a mounter provided with a board holding device that holds the circuit board, a component supply device that supplies electronic components, and a mounting device that picks up the electronic component supplied by the component supply device and mounts the picked up component on the circuit board held by the board holding device by raising and lowering a component holding tool;
an elapsed time acquiring section that acquires an elapsed time from a time of printing onto the circuit board by the solder printer until the circuit board arrives in position to mount the electronic component; and
a raising and lowering operation changing section that changes raising and lowering operation of the component holding tool when the elapsed time from printing acquired by the elapsed time acquiring section exceeds an allowance time, which is a maximum elapsed time from the time of printing before the solder dries, wherein
the mounter mounts the electronic component on the solder printed on the circuit board by the solder printer by raising and lowering the component holding tool according to the raising and lowering operation changed by the raising and lowering operation changing section.

2. The electronic component mounting system according to claim 1, wherein
the raising and lowering operation changing section includes a mounting parameter determining section that determines a mounting parameter, which is a parameter used for control of raising and lowering operation of the component holding tool, based on the elapsed time from printing, and the mounter mounts the electronic component on the solder on the circuit board according to the mounting parameter determined by the mounting parameter determining section.

3. The electronic component mounting system according to claim 2, wherein
the mounting parameter is a pressing force that is a pressing force with which the component holding tool presses the electronic component against the solder printed on the circuit board.

4. The electronic component mounting system according to claim 2, wherein
the mounting parameter is a pressing time that is a length of time for which the component holding tool presses the electronic component against the solder printed on the circuit board.

5. The electronic component mounting system according to claim 1, wherein
the elapsed time acquiring section, as the elapsed time from printing, acquires the elapsed time that is from a point in time at which printing on the circuit board by the solder printer was completed to a point in time at which the circuit board arrived at the mounter,
the electronic component mounting system is further provided with an estimated required time memorizing section that memorizes an estimated required time, which is a time estimated to be required from the point in time at which the circuit board arrived at the mounter until work scheduled to be performed by the mounter is completed,
and further wherein
the raising and lowering operation changing section changes raising and lowering operation of the component holding tool based on the elapsed time from printing acquired by the elapsed time acquiring section and the estimated required time memorized by the estimated required time memorizing section.

6. The electronic component mounting system according to claim 5, wherein
the estimated required time is a time estimated to be required from the point in time at which the circuit board arrived at the mounter until a final work out of a series of work to be performed by the mounter is completed.

7. The electronic component mounting system according to claim 2, further provided with a correlation data memorizing section that memorizes correlation data, which is data representing a relationship between the elapsed time from printing and the mounting parameter appropriate for mounting the electronic component on the printed solder, wherein
the correlation data memorizing section memorizes different correlation data according to solder type.

8. An electronic component mounting system comprising:
a solder printer that prints solder paste onto a circuit board;
a mounter provided with a board holding device that holds the circuit board, a component supply device that supplies electronic components, and a mounting device that picks up the electronic component supplied by the component supply device and mounts the picked up component on the circuit board held by the board holding device by raising and lowering a component holding tool;
an elapsed time acquiring section that acquires an elapsed time from a time of printing onto the circuit board by the solder printer until the circuit board arrives in position to mount the electronic component;
an estimated elapsed time calculating section that calculates an estimated elapsed time based on a sum of the elapsed time acquired by the elapsed time acquiring section and an estimated required time, which is a time estimated to be required from a point in time at which circuit board arrives in the position to a point in time at which work to be performed at the position is scheduled to be completed; and
a raising and lowering operation changing section that changes raising and lowering operation of the component holding tool when the estimated elapsed time calculated by the estimated elapsed time calculating section exceeds an allowance time, which is a maximum elapsed time from the time of printing before the solder dries, wherein
the mounter mounts the electronic component on the solder printed on the circuit board by the solder printer by raising and lowering the component holding tool according to the raising and lowering operation changed by the raising and lowering operation changing section.

* * * * *